US008236115B2

(12) United States Patent  (10) Patent No.: US 8,236,115 B2
Jamil et al.  (45) Date of Patent: Aug. 7, 2012

(54) METHOD FOR ENSHROUDING AN ACTUATOR

(75) Inventors: Shahid Jamil, Chatham (GB); Joachim Vendulet, Niederkirchen (DE); Jean-Pierre Winandy, Arlon (BE); Joachim R Kiefer, Losheim am See (DE)

(73) Assignee: Delphi Technologies Holdings S.arl, Troy, MI (US)

( * ) Notice: Subject to any disclaimer, the term of this patent is extended or adjusted under 35 U.S.C. 154(b) by 828 days.

(21) Appl. No.: 12/226,946

(22) PCT Filed: Feb. 21, 2007

(86) PCT No.: PCT/GB2007/000623
§ 371 (c)(1),
(2), (4) Date: Feb. 18, 2009

(87) PCT Pub. No.: WO2007/128948
PCT Pub. Date: Nov. 15, 2007

(65) Prior Publication Data
US 2009/0304957 A1   Dec. 10, 2009

(30) Foreign Application Priority Data
May 3, 2006 (EP) .................................... 06252352

(51) Int. Cl.
*B32B 1/02* (2006.01)
*B65B 7/00* (2006.01)
(52) U.S. Cl. ......................................... 156/69; 428/34.1
(58) Field of Classification Search ................. 428/34.1; 156/69
See application file for complete search history.

(56) References Cited

U.S. PATENT DOCUMENTS

| 4,465,547 | A | | 8/1984 | Belke, Jr. et al. |
| 4,778,851 | A | * | 10/1988 | Henton et al. ................... 525/65 |
| 5,326,643 | A | * | 7/1994 | Adamopoulos et al. ... 428/472.2 |
| 5,776,235 | A | | 7/1998 | Camilletti et al. |
| 5,882,466 | A | * | 3/1999 | Grootaert et al. ............. 156/329 |
| 6,274,967 | B1 | | 8/2001 | Schuh et al. |
| 2002/0163282 | A1 | | 11/2002 | Heinz |
| 2003/0107301 | A1 | | 6/2003 | Asano et al. |
| 2004/0113525 | A1 | * | 6/2004 | Hardy et al. ................... 310/328 |

(Continued)

FOREIGN PATENT DOCUMENTS

EP    0 698 485    2/1996

(Continued)

OTHER PUBLICATIONS

International Search Report dated Jun. 26, 2007.

(Continued)

*Primary Examiner* — Philip Tucker
*Assistant Examiner* — Daniel Lee
(74) *Attorney, Agent, or Firm* — Thomas N. Twomey

(57) ABSTRACT

A method for enshrouding an actuator for use in a fuel injector, comprising the steps of providing an actuator having a body section, a first end piece and a second end piece; providing a shroud having first and second ends; applying a sealant material to at least one portion of an exterior surface of the end pieces, and/or to at least one part of the shroud; and enshrouding the actuator with the shroud, such that the sealant material provides an intermediate layer between the end pieces and the shroud and forms a fluid-tight seal between them.

18 Claims, 2 Drawing Sheets

U.S. PATENT DOCUMENTS

2004/0122153 A1* 6/2004 Guo et al. .................... 524/430
2004/0266901 A1  12/2004 Shibuya et al.

FOREIGN PATENT DOCUMENTS

| | | |
|---|---|---|
| EP | 0 954 037 | 11/1999 |
| JP | 2-276280 | 11/1990 |
| JP | 10-183063 | 7/1998 |
| JP | 11-106443 | 4/1999 |
| JP | 2002-53735 | 2/2002 |
| JP | 2003-180090 | 6/2003 |
| JP | 2003-292477 | 10/2003 |
| JP | 2004-251368 | 9/2004 |
| WO | 02/061856 | 8/2002 |

OTHER PUBLICATIONS

Japan Office Action dated May 12, 2011.
Japan Office Action dated Mar. 13, 2012.

* cited by examiner

METHOD FOR ENSHROUDING AN ACTUATOR

TECHNICAL FIELD

The invention relates to an actuator arrangement for use in a fuel injector of the type intended for use in a fuel system of an internal combustion engine.

BACKGROUND OF THE INVENTION

In a known fuel injector, a piezoelectric actuator is operable to control the delivery of fuel into a combustion space. The piezoelectric actuator typically includes a stack of piezoelectric elements across which a voltage is applied in use through an electrical connector. A fuel injector of this type is described in the Applicant's granted patent EP 0995901.

It is known to arrange the piezoelectric stack within an accumulator volume in the injector that is arranged, in use, to receive high-pressure fuel. Commonly, therefore, the piezoelectric actuator is immersed in fuel throughout its operational life. Moreover, when the fuel injection system is in use, the actuator is exposed to fuel at rail pressure ranging from, for example, 200 to 2000 bar. It is reasonable to expect an injector to have a lifetime of 15 years (>130000 hours). The fuel may be, for example, diesel, biodiesel, gasoline or mixtures optionally containing water and/or alcohol. It is also important to protect the piezoelectric actuator from environmental contaminants such as moisture. The presence of a fluid in the actuator can cause electrochemical effects and lead to a short circuit failure.

Thus, to protect the piezoelectric actuator from damage, it is important that the actuator is sealed so as to prevent fuel within the accumulator volume from entering the interior of the actuator and to prevent the ingress of fuel into the joints between the individual elements that form the actuator.

When the actuator is used in a hydrostatically pressurized mode, as described for example in the Applicant's granted patent EP 1096137, the piezoelectric actuator must be protected from the ingress of hydrostatic pressurised fluid.

The piezoelectric actuator can be provided with a coating or sleeve composed of a flexible sealant material, as described, for example, in EP 0995901. The coating helps to seal the elements of the piezoelectric actuator from fuel in the accumulator volume. Further, since the coating is flexible, the actuator is subjected to the compressive load applied by the fuel under pressure, helping to reduce the propagation of cracks in the structure. For this purpose, it is known to use an over-moulding technique to encapsulate the piezoelectric actuator within a plastics coating, or a sleeve member as described in the Applicant's granted patent application WO 02/061856. The coating or sleeve may also encapsulate the electrical connector, as described in the Applicant's granted patent EP 1079097. The sleeve is preferably formed from a low permeability fluoropolymer such as, for example, ethylene tetrafluoroethylene (ETFE), polytetrafluoroethylene (PTFE), fluorinated ethylene propylene (FEP), perfluoroalkoxy (PFA), or polyvinylidene fluoride (PVDF).

It has been observed, however, that there may still be ingress of fluid into the interface between the actuator and the coating or sleeve. For example, the aforementioned sleeves are preferably formed from elastic or heat-shrink materials such as tubes with open first and second ends such that the actuator can be inserted into the open tube. The tube is then allowed to contract elastically, or is made to contract by the application of heat (i.e. heat shrinkage), in order to encapsulate the actuator. It will be understood that although the sleeve now bears tightly against the actuator, the first and second ends of the tube present paths for the ingress of fluid into the interface between the coating and the encapsulated actuator.

One or more clips may be provided at the ends of the sleeve in order to improve end sealing, as described in the Applicant's co-pending application EP 05256852. The clips are placed externally with respect to the sleeve and exert a constrictive force sufficient to urge the sleeve against the underlying external surface of the actuator so as to create a seal at the interface between the sleeve and the actuator surface. Nevertheless, under the challenging environmental conditions within a fuel injector there remains a risk that fluid may migrate underneath the ends of the sleeve despite the presence of the clips.

It is known to provide a filler material, as described, for example, in the Applicant's co-pending application WO 02/061856, between the coating and the encapsulated actuator in an attempt to limit the ingress of fluid between the coating and the actuator. However, this requires filling the entire space defined between the coating and the actuator with a curable substance, and may also require a degassing step, which adds to the complexity of the actuator arrangement and the method of assembly.

It is an object of the present invention to alleviate the above-mentioned problems but without adding significantly to the cost, complexity or size of the actuator arrangement.

SUMMARY OF THE INVENTION

In a first aspect of the invention, there is provided a method for enshrouding an actuator for use in a fuel injector, comprising the steps of providing an actuator, having a body section, a first end piece and a second end piece; providing a shroud having first and second ends; applying a sealant material to at least one portion of an exterior surface of the end pieces, and/or to at least one part of the shroud; and enshrouding the actuator with the shroud, such that the sealant material provides an intermediate layer between the end pieces and the shroud and forms a fluid-tight seal between them. Suitably, the shroud comprises a material selected from a fluoropolymer or a thermoplastic polymer.

In a preferred embodiment, the sealant material is an adhesive. Suitably, the adhesive is selected from the group comprising silicones, fluorosilicones, fluorocarbon polymers, epoxies and cyanurates. Preferably the adhesive is a toughened epoxy, ideally a core-shell toughened epoxy. Preferably the adhesive has a high cross-linking density and a glass transition temperature above 80° C., ideally above 90° C.

In a preferred embodiment, the method comprises the additional step of applying a coupling agent to at least one surface that will contact the sealant material, prior to application of the sealant material. Suitably, the coupling agent comprises an adhesion promoter, ideally a silane, and most ideally a functional silane adapted to react with the surface of the end pieces of the actuator and/or with the surface of the sleeve, and with the sealant material of the intermediate layer.

Preferably, the adhesion promoter is selected from acryloxypropyl)trimethoxysilane, 3-aminopropyltriethoxysilane, 3-aminopropyltrimethoxysilane, aminopropylsilanetriol, N-(2-aminoethyl)-3-aminopropyltrimethoxysilane, (3-glycidoxypropyl)trimethoxysilane, (3-glycidoxypropyl)methyldiethoxysilane, 3-chloropropyltrimethoxysilane, 3-isocyanatopropyltriethoxysilane, vinyltriethoxysilane, vinyltrimethoxysilane, bis(trimethoxysilylpropyl)amine, and bis[3-trimethoxysilyl)propyl]-ethylenediamine.

The coupling agent may comprise a mixture of one or more adhesion promoters.

In an embodiment of the invention, the shroud comprises a plurality of layers or coatings. Suitably, at least one layer or coating comprises a fluoropolymer. Preferably, at least one layer or coating comprises a material adapted to regulate the permeation of ionic species through the shroud.

In another embodiment of the invention, the method comprises the additional step of applying a clip externally to the shroud, the clip being adapted to apply a constrictive force to the shroud and urge the shroud towards the underlying intermediate layer.

In a second aspect of the invention, there is provided an enshrouded actuator arrangement, comprising an actuator having a body section, a first end piece and a second end piece; and a shroud, comprising a fluoropolymer; characterised in that the arrangement further comprises: an intermediate layer comprising a sealant material, the intermediate layer being disposed between a portion of the first end piece and the shroud; and an intermediate layer comprising a sealant material, the intermediate layer being disposed between a portion of the second end piece and the shroud; such that the sealant layers form a fluid-tight seal between the end pieces and the shroud.

Preferably the sealant material comprises an adhesive selected from the group comprising silicones, fluorosilicones, fluorocarbon polymers, epoxies and cyanurates. Suitably the adhesive is a toughened epoxy, preferably a core-shell toughened epoxy.

BRIEF DESCRIPTION OF DRAWINGS

Embodiments of the present invention will now be described, by way of example only, with reference to the accompanying drawings, in which.

DETAILED DESCRIPTION OF THE PREFERRED EMBODIMENTS

Figure 1:
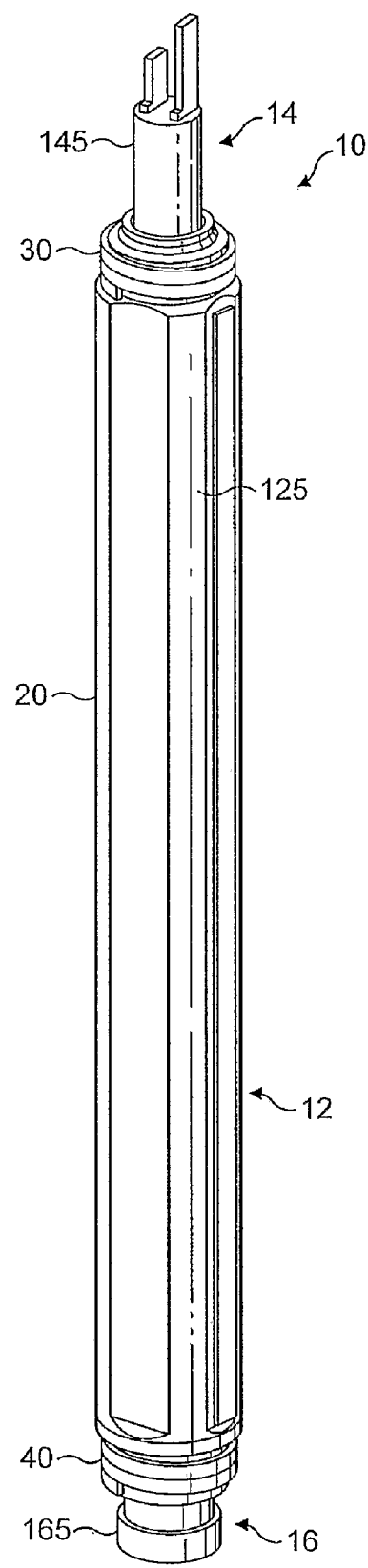
FIG. 1 is a perspective view of a piezoelectric actuator arrangement assembled according to the method of the invention.

FIG. 1 shows an actuator arrangement 10 comprising a known piezoelectric actuator 20 that has been encapsulated in accordance with the method of the present invention. The actuator 20 comprises at least one piezoelectric element (not shown), and is suitable for use in a fuel injector of an internal combustion engine.

The actuator 20 includes a generally cylindrical body section 12, comprising a central major portion 125 containing a piezoelectric element or stack, and first and second ends. An end piece 14, at the first end of the body section 12 (upper end in the orientation shown), includes an electrical connector 145 with first and second terminals which in use receives a voltage from a voltage supply (not shown), and a portion 18 that abuts the first end of the body section 12. A second end piece 16, at the second end of body section 12 (lower end in the orientation shown), includes a load transmitting member 165 which in use co-operates with a control piston or valve needle (not shown) of the fuel injector, and a portion 19 that abuts the second end of the body section 12.

Details of the piezoelectric stack and internal components of actuator 20 and a description of how the actuator operates are disclosed fully in the Applicant's granted patent EP 0995901, so will not be described here.

Figure 2:
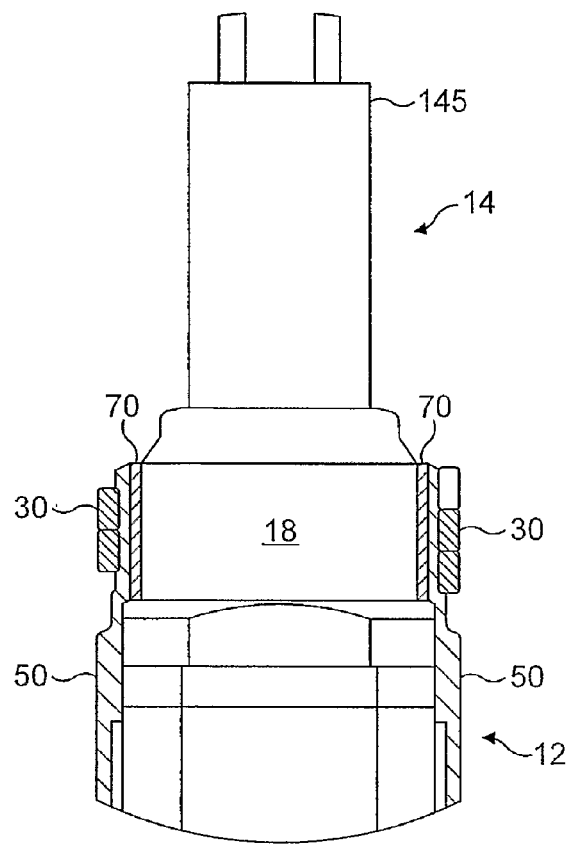
FIG. 2 is an enlarged sectional view of a first end of the actuator arrangement of FIG. 1.
Figure 3:
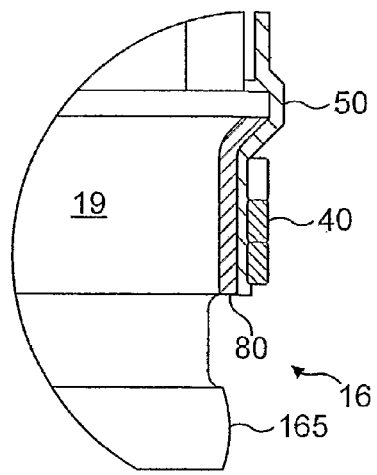
FIG. 3 is an enlarged sectional detail view of part of a second end of the actuator of FIG. 1.

Evident from FIGS. 2 and 3 is the presence of a flexible sleeve 50 having first and second ends corresponding to the first and second ends respectively of the actuator 20, and which enshrouds and is conformed to the contours of the actuator 20. The sleeve 50 extends along the length of the actuator 20 from the upper end piece 14 to the lower end piece 16.

At the first end of the actuator 20, just short of the electrical connector 145, at the portion 18, there is provided an intermediate layer 70 between the external surface of the end piece 14 and the internal surface of the sleeve 50. At the second end of actuator 20, just short of load transmitting member 165, at the portion 19, there is provided a similar intermediate layer 80 between the external surface of the end piece 16 and the internal surface of the sleeve 50.

The intermediate layers 70, 80 comprise a cured or set sealant material, such as an adhesive, such that the intermediate layers 70, 80 bond the sleeve 50 to, respectively, the portions 18, 19 to form a fluid-tight seal at either end of the actuator 20. In a preferred embodiment, the intermediate layers 70, 80 comprise a core-shell toughened epoxy with high cross-linking density and a glass transition temperature above 90° C.

According to the method of the present invention, the actuator 20 is encapsulated as follows. An adhesion promoter is applied to the exterior surface of the two end pieces 14, 16 at the respective portions 18, 19 and subsequently cured. The adhesion promoter is also applied to the interior surface of sleeve 50 and cured. Adhesive is applied to the portions 18, 19 on top of the area previously treated with adhesion promoter. The sleeve 50 is applied so as to enshroud the actuator 20 such that the interior surface of the sleeve 50, previously treated with adhesion promoter, contacts the adhesive.

It will be appreciated that the adhesive could optionally be applied to the interior surface of the sleeve 50 instead of, or in addition to, the exterior surface of the end pieces 14, 16. Ideally, the adhesive contacts a surface that has been treated with adhesion promoter although, optionally, the adhesive may contact a surface that has not been treated with adhesion promoter. It is preferred that the adhesion promoter and adhesive are not applied to the surface of central portion 125, which contains the piezoelectric stack.

Suitably, adhesive may be applied to a thickness of between about 50 nanometers and about 200 micrometers. Preferably, adhesive may be applied to a thickness of 10 to 50 micrometers.

The adhesion promoter of the present invention may be any suitable coupling agent, but is preferably a silane, suitably a functionalised silane. The adhesion promoter preferably comprises one or more functional groups adapted for reaction with the surfaces to which it is applied, and one or more functional groups adapted for reaction with the sealant layer. Suitable coupling agents/adhesion promoters may be generally described by the following formula:

$$Y_a\text{—}L\text{—}M\text{—}X_b$$

wherein Y is an organofunctional group, L is a linker, M is preferably a metal or semi-metal (metalloid) atom, and X is a hydrolysable group. The molecule may comprise more than one organofunctional (Y) group and/or more than one hydrolysable (X) group, preferably such that a=1-3 and b=1-3.

Suitably, the organofunctional group (Y) is adapted to react with functional groups of the adhesive, and the hydrolysable group (X) is adapted to react with the surface of the end pieces 14, 16 and/or the sleeve 50. Preferably, this results in covalent bonding between the adhesive and the surface.

M is preferably silicon, or a transition metal such as aluminium, titanium or zirconium. Alternatively, atom M may be selected from organic coupling agents where M is, for example, a carbon atom. The organofunctional group Y may be selected from amino (R—NH) or amine (R—NH$_2$) groups, where R is an organic group being either aliphatic or aromatic or another amino group. Alternatively, Y may be selected from epoxy, isocyanate, methacrylate or vinyl groups. The linker L is preferably an aliphatic group (CH$_2$)n wherein n=1-10, or an ether group, an ester group, or an aromatic group. Preferably, at least one of the hydrolysable groups, X, is an alkoxy group (OR$_1$) such as, for example, methoxy (R$_1$=CH$_3$), ethoxy (R$_1$=C$_2$H$_5$) or propoxy (R$_1$=C$_3$H$_7$). X may also comprise methyl, ethyl or propyl groups, or acyloxy, halogen or amine.

By way of example, the adhesion promoter may be selected from the list comprising:
(3-acryloxypropyl)trimethoxysilane
3-aminopropyltriethoxysilane
3-aminopropyltrimethoxysilane
aminopropylsilanetriol
N-(2-aminoethyl)-3-aminopropyltrimethoxysilane
(3-glycidoxypropyl)trimethoxysilane
(3-glycidoxypropyl)methyldiethoxysilane
3-chloropropyltrimethoxysilane
3-isocyanatopropyltriethoxysilane
vinyltriethoxysilane
vinyltrimethoxysilane
or the adhesion promoter may be a dipodal coupling agent such as, for example:
bis(trimethoxysilylpropyl)amine
bis[3-Trimethoxysilyl)propyl]-ethylenediamine
or the adhesion promoter may comprise any suitable mixture of the above non-limiting examples and appropriate solvents, as will be appreciated by one skilled in the art.

The adhesion promoter may be adapted to react with itself to form a very thin layer. The adhesion promoter may comprise functional groups that can react upon the application of heat. Preferably, the application of adhesion promoter should lead to a change in surface tension of the surface to which it is applied. Suitably, the adhesion promoter is applied to the surface of the portions 18, 19 and/or the sleeve 50 in the form of a resin, but may optionally be a gel, liquid, powder, or any other suitable form. The adhesion promoter may be deposited using a deposition technique such as, for example, dipping, spraying, spin coating or vapour deposition.

The adhesion promoter may be cured by heat treatment, or by irradiation, or by evaporation of solvent, or by exposure to ambient humidity. It will be appreciated by one skilled in the art that any one of these methods may be more or less suited to curing the particular adhesion promoter used. In addition, the adhesive may be cured by similar methods.

The sealant material used to form the intermediate layers 70, 80 may be selected from the list comprising thermosets or elastomers. Suitable elastomers may include silicones, fluorosilicones and fluorocarbon polymers. Suitable thermosets may include epoxies and cyanurates. Preferably the adhesive is a toughened epoxy, comprising tougheners selected from rubber tougheners or core-shell tougheners. Most suitably the adhesive is a core-shell toughened epoxy, and has a high cross-linking density. Suitably, the adhesive has a glass transition temperature above 80° C., preferably above 90° C. Optionally, the adhesive material may be adapted to contain advantageous materials or substances, for example free radical or ionic species scavenger compounds or preservatives.

In a preferred embodiment, the sleeve 50 comprises a tube of heat-shrink material with open first and second ends, and is made to shrink around the actuator 20 by the application of heat. Suitably, the adhesion promoter and/or adhesive is/are adapted such that they are not fully cured by the process of heat-shrinking the sleeve 50. A further heat treatment may be applied after the sleeve has been shrunk, in order to ensure full reaction of the adhesive with the adhesion promoter and to maximise adhesion strength.

In an embodiment of the invention, as shown in FIGS. 1 to 3, clips 30, 40 are provided at the first and second ends of the actuator 20. Clips of this kind are disclosed fully in, for example, the Applicant's co-pending application EP 05256852, so will not be described in detail here.

The clips 30, 40 are positioned externally with respect to the sleeve 50, such that the interior surface of the clips 30, 40 bears against the exterior of the sleeve 50 and exerts a constrictive force upon thereon that is sufficient to urge the interior surface of the sleeve 50 against the intermediate layers 70, 80. One of the clips 30 encircles the upper end piece 14 just short of electrical connector 145, whilst the other clip 40 encircles the lower end piece 16 just short of load transmitting member 165.

During assembly, the clips 30, 40 are applied over the sleeve 50 such that the interior surface of the sleeve 50, coated with dry adhesion promoter, is held against the intermediate layers 70, 80.

Several variations are possible within the inventive concept. For instance, the sleeve 50 is an example of various shrouds that could be used to enshroud the actuator 20. Preferably, the shroud is a tube with first and second open ends such that the actuator 20 can be inserted into the open tube. Suitably, the shroud is composed of a heat shrink polymer that can be made to shrink to fit the contours of the enshrouded actuator upon the application of heat. Preferably, the shroud is formed from a fluoropolymer such as ethylene tetrafluoroethylene (ETFE), polytetrafluoroethylene (PTFE), fluorinated ethylene propylene (FEP), perfluoroalkoxy (PFA), or polyvinylidene fluoride (PVDF). The shroud may also be a high performance thermoplastic overmoulding, suitably a semi-crystalline thermoplastic. Examples of materials suitable for use in thermoplastic overmoulding may include polyphenylene sulfide (PPS), polyamidimides (PAI), polysulfones (PSU), polyethersulfones (PES), polybenzimidazoles (PBI), polyetherketones (PEK), polyetheretherketones (PEEK), polyetherimide (PEI), polyimide (PI), polyphenylenterephtalamide (PPA), and liquid crystalline polymers (LCP).

The surface of the portions 18, 19 of the end pieces 14, 16 and/or the shroud 50 may be treated prior to the application of adhesion promoter, or prior to contact with the intermediate layer 70, 80 if adhesion promoter is not used, in order to further improve adhesion to the intermediate layer 70, 80. A suitable treatment may comprise, for example, chemical etching.

A further suitable treatment process is to apply a gas plasma treatment to the active portions 18, 19 of the end pieces 14, 16 prior to the application of the adhesion promoter. Plasma treatment processes are effective at altering the surface of materials to improve their reactive properties. In the invention, the applied gas plasma increases the functional groups present on the surface of the end pieces 14, 16. The adhesion promoter bonds with the functional groups. The adhesive bonds with the adhesion promoter more effectively.

As an alternative to gas plasma treatment, it is also possible to use a combustion driven chemical vapour deposition process to deposit an amorphous silicate layer onto the end pieces 14, 16 with the same benefit of improving the bonding strength between the sleeve 50 and the end pieces 14, 16.

One or more additional layers or coatings may be provided instead of, or in addition to, the sleeve 50. For example, although not shown in the accompanying drawings, a polymeric passivation layer may be provided immediately adjacent the surface of the stack, radially inwardly of the sleeve 50. Such a passivation layer is known to be suitable for suppressing electrical arcing over the surface of the stack, sometimes referred to in the art as 'surface flashovers'. Another such layer may be a barrier layer as described, for example, in the Applicant's co-pending applications GB 0602956.5 and GB 0604467.1. It will be appreciated that adhesive may be provided between the surface of the enshrouded actuator and the sleeve or barrier layer adjacent to it, and between this and each additional layer. It should therefore be appreciated that the term 'actuator' should be construed as referring to a complete functioning piezoelectric device including all protective measures, e.g. as described above, applied thereto.

In addition to the intermediate layer 70, 80 of the present invention, optionally there may be at least one filler material or other substance disposed between the exterior surface of the actuator and the interior surface of the sleeve.

It will be appreciated that the actuator 20 may be of any type. When the encapsulated actuator arrangement is disposed within a fuel injector system, it may be exposed to fuel comprising diesel, biodiesel, gasoline or mixtures optionally containing water and/or alcohol.

Having described particular preferred embodiments of the present invention, it is to be appreciated that the embodiments in question are exemplary only and that variations and modifications such as will occur to those possessed of the appropriate knowledge and skills may be made without departure from the scope of the invention as set forth in the appended claims.

The invention claimed is:

1. A method for enshrouding an actuator for use in a fuel injector, comprising the steps of:
    providing an actuator having a body section, a first end piece, and a second end piece;
    providing a flexible shroud having first and second ends;
    applying a sealant material to at least one portion of an exterior surface of the end pieces, and/or to at least one corresponding part of the shroud such that the sealant material is disposed only between the shroud and the end pieces; and
    enshrouding the actuator with the shroud, such that the shroud extends along the length of the actuator from the first end piece to the second end piece and is conformed to the contours of the actuator and such that the sealant material provides an intermediate layer between the end pieces and the shroud and forms a fluid-tight seal between them.

2. A method according to claim 1, wherein the shroud comprises a material selected from a fluoropolymer and a thermoplastic polymer.

3. A method according to claim 1, wherein the sealant material is an adhesive.

4. A method according to claim 3, wherein the adhesive is selected from the group consisting of silicones, fluorosilicones, fluorocarbon polymers, epoxies and cyanurates.

5. A method according to claim 3, wherein the adhesive is a toughened epoxy.

6. A method according to claim 5, wherein the adhesive is a core-shell toughened epoxy.

7. A method according to claim 1, wherein the method comprises the additional step of applying a coupling agent to at least one surface that will contact the sealant material, prior to application of the sealant material.

8. A method according to claim 7, wherein the coupling agent comprises an adhesion promoter.

9. A method according to claim 8, wherein the adhesion promoter comprises a silane.

10. A method according to claim 9, wherein the adhesion promoter comprises a functional silane adapted to react with the surface of the end pieces and/or the sleeve, and with the sealant material of the intermediate layer.

11. A method according to claim 8, wherein the adhesion promoter is selected from the following:
    (3-acryloxypropyl)trimethoxysilane;
    3-aminopropyltriethoxysilane;
    3-aminopropyltrimethoxysilane;
    aminopropylsilanetriol;
    N-(2-aminoethyl)-3-aminopropyltrimethoxysilane;
    (3-glycidoxypropyl)trimethoxysilane;
    (3-glycidoxypropyl)methyldiethoxysilane;
    3-chloropropyltrimethoxysilane;
    3-isocyanatopropyltriethoxysilane;
    vinyltriethoxysilane;
    vinyltrimethoxysilane;
    bis(trimethoxysilylpropyl)amine; and
    bis [3-trimethoxysilyl)propyl]-ethylenediamine.

12. A method according to claim 7, wherein the coupling agent comprises a mixture of one or more adhesion promoters.

13. A method according to claim 7, further including the step of applying a gas plasma treatment process to the at least one surface prior to the application of the coupling agent.

14. A method according to claim 7, further including the step of applying an amorphous silicate layer to the at least one surface by way of a combustion driven chemical vapour deposition process prior to the application of the coupling agent.

15. A method according to claim 1, wherein the shroud comprises a plurality of layers or coatings.

16. A method according to claim 15, wherein at least one of the plurality of layers or coatings comprises a fluoropolymer.

17. A method according to claim 15, wherein at least one of the plurality of layers or coatings comprises a material adapted to regulate the permeation of ionic species through the shroud.

18. A method according to claim 1, wherein the method comprises the additional step of applying a clip externally to the shroud, the clip being adapted to apply a constrictive force to the shroud and urge the shroud towards the underlying intermediate layer.

* * * * *